US007855597B2

(12) United States Patent
Chen et al.

(10) Patent No.: US 7,855,597 B2
(45) Date of Patent: Dec. 21, 2010

(54) CLASS-D AMPLIFIER (75) Inventors: Ming-Hsiung Chen, Taipei (TW); Shang-Shu Chung, Taipei (TW); Tung-Sheng Ku, Taipei (TW)

(73) Assignee: Amazing Microelectronic Corp., Taipei County (TW)

( * ) Notice: Subject to any disclaimer, the term of this patent is extended or adjusted under 35 U.S.C. 154(b) by 0 days.

(21) Appl. No.: 12/622,828

(22) Filed: Nov. 20, 2009

(65) Prior Publication Data
US 2010/0253427 A1 Oct. 7, 2010

(30) Foreign Application Priority Data
Apr. 3, 2009 (TW) .............................. 98205438 U (51) Int. Cl.
H03F 3/38 (2006.01)

(52) U.S. Cl. ...................... 330/10; 330/207 A; 330/251
(58) Field of Classification Search .................. 330/10, 330/207 A, 251
See application file for complete search history.

(56) References Cited

U.S. PATENT DOCUMENTS

| 6,614,297 | B2* | 9/2003 | Score et al. .................... 330/10 |
| 6,847,257 | B2* | 1/2005 | Edwards et al. ............... 330/10 |
| 7,332,962 | B2* | 2/2008 | Wu et al. ..................... 330/251 |
| 7,545,207 | B2* | 6/2009 | Chang et al. .................. 330/10 |
| 7,659,789 | B2* | 2/2010 | Zhu et al. .................... 332/109 |
| 7,741,902 | B2* | 6/2010 | Guo et al. ..................... 330/10 |
| 7,795,970 | B2* | 9/2010 | Kaya et al. ................... 330/251 |

* cited by examiner

Primary Examiner—Patricia Nguyen
(74) Attorney, Agent, or Firm—Tim Tingkang Xia; Morris, Manning & Martin, LLP (57) ABSTRACT The invention discloses a class-D amplifier, which is used for driving a two-terminal load according to a set of analog signals. The D-class amplifier includes a pulse-width modulation (PWM) circuit, a signal processing circuit and a driving amplifier circuit. The PWM circuit receives the set of analog signals and converts them into a set of PWM signals with identical phase. The signal processing circuit generates a set of pulse signals which are attached to the set of PWM signals respectively. The driving amplifier circuit is coupled between the signal processing circuit and the two-terminal load. The driving amplifier circuit receives and amplifies the set of PWM signals. According to the set of PWM signals, the driving amplification circuit drives the two-terminal in a filterless way.

7 Claims, 6 Drawing Sheets

CLASS-D AMPLIFIER

BACKGROUND OF THE INVENTION

1. Field of the Invention

The invention relates to a class-D amplifier and, more particularly, to a class-D amplifier capable of pushing a two-terminal load in a filterless way.

2. Description of the Prior Art

Compared with the class A amplifier which has low distortion along with high power consumption and the class B amplifier which has low power consumption along with crossover distortion, the class AB amplifier and the class-D amplifier are the in-between amplifier types which can balance the power consumption and the signal quality. Therefore, the class AB and class-D amplifiers are widely applied in audio broadcasters and multimedia players. The main difference between these two types of amplifiers is that, the class AB amplifier utilizes the linear region of the power transistor for amplifying signals, and on the other hand the class-D amplifier operates by the pulse-width modulation (PWM) technology.

Figure 1:
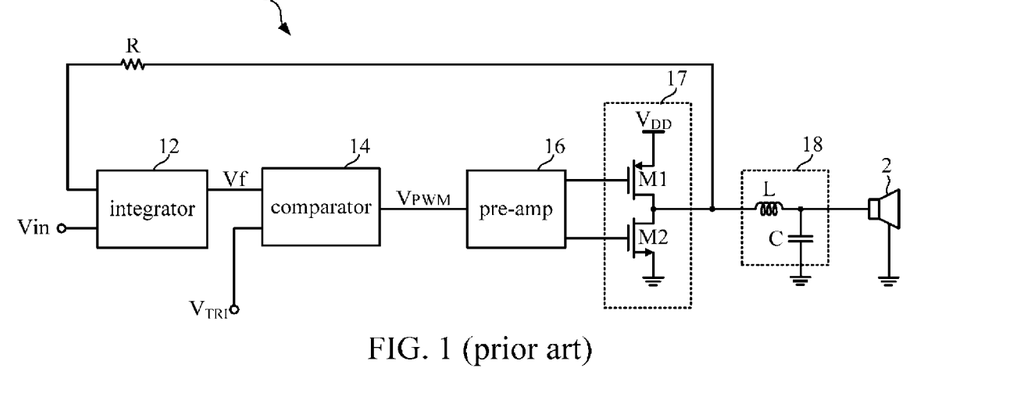
FIG. 1 is a schematic diagram illustrating a half-bridge class-D amplifier in prior art.
Figure 2:
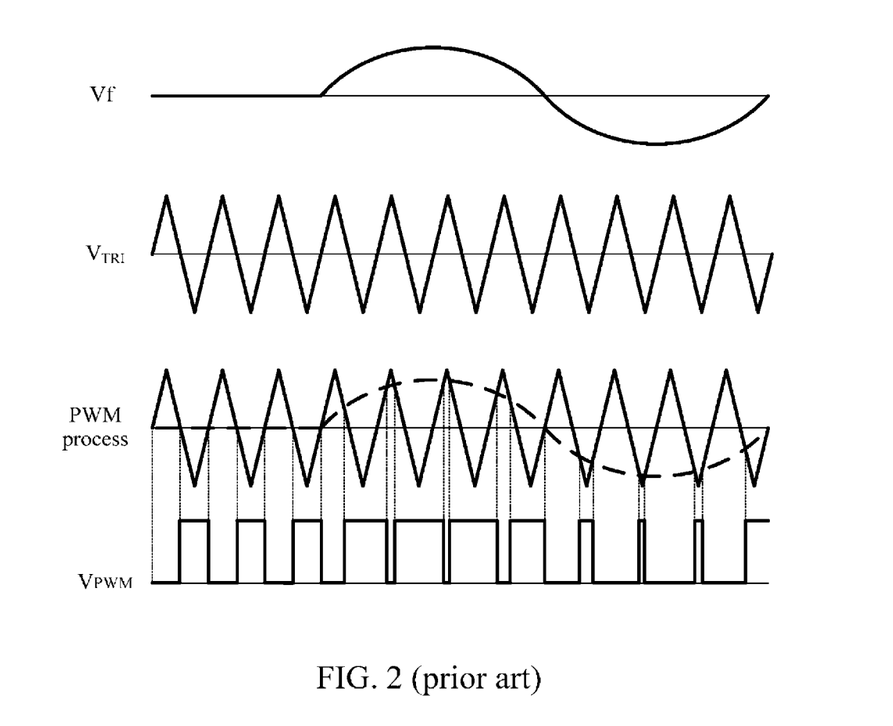
FIG. 2 is a timing diagram illustrating a signal sampling example of an integration signal, a triangle wave signal, a PWM signal in the class-D amplifier in prior art.

Please refer to FIG. 1 and FIG. 2. FIG. 1 is a schematic diagram illustrating a half-bridge class-D amplifier 1 in prior art. FIG. 2 is a timing diagram illustrating a signal sampling example of an integration signal Vf, a triangle wave signal $V_{TRI}$, a PWM signal $V_{PWN}$ in the class-D amplifier 1 in prior art. The class-D amplifier 1 includes an integrator 12, a comparator 14, a driving amplification circuit (including a pre-amp stage 16 and a power amplifier stage 17) and a filter 18. As shown in FIG. 1, one input terminal of integrator 12 is used for receiving an analog signal Vin, and the other input terminal of the integrator 12 is connected to an output node of the power amplifier stage 17 via a resistor R.

The analog signal Vin is integrated by the integrator 12 and transformed into the integration signal Vf. The outcome of the integrator 12 (the integration signal Vf) and a triangle wave signal $V_{TRI}$ are compared by the comparator 14. The triangle wave signal $V_{TRI}$ can serve as the reference for sampling the integration signal Vf. Therefore, the triangle wave signal Vf must have a frequency which is much higher than the frequency of the analog signal Vin, to achieve high quality in sampling.

When the voltage of the integration signal Vf exceeds the voltage of the triangle wave signal $V_{TRI}$, the outcome of the comparator 14 is a PWM signal $V_{PWN}$ at high level (H); when the voltage of the integration signal Vf is lower than the voltage of the triangle wave signal $V_{TRI}$, the outcome of the comparator 14 is a PWM signal $V_{PWN}$ at low level (L). The combination of the integrator and the comparator is usually view as the PWM circuit. The origin analog signal can be transformed by the PWM circuit into the digital PWM signal. The amplitude of the origin analog signal is proportional to the high level part out of the digital PWM signal.

Then, the PWM signal $V_{PWN}$ generated by the comparator 14 is further amplified by the pre-amp stage 16, for driving the following power amplifier stage 17, in other words, for controlling the on/off state of the power amplification transistors M1, M2. The power amplifier stage 17 is used for amplifying the power of the output signal. The filter 18, connected with the power amplifier stage 17, includes an inductor L and a capacitor C. The filter 18 is used for filtering out the carrier wave of the PWM signal $V_{PWN}$ and recovering the waveform of the output signal (back to an analog format). The recovered analog signal generated by the class-D amplifier 1 is provided to the load (the speaker 2 in FIG. 1), and it can serve as the driving signal to the speaker 2.

As shown in FIG. 2. When the integration signal Vf is stable at one level (i.e. there is no active input), the PWM signal $V_{PWN}$ has a 50-50 voltage level distribution, 50% at high level and 50% at low level. In this case, one terminal of the speaker 2 is driven by the input signal and the other terminal of the speaker 2 is grounded. In order to prevent the speaker 2 from being damaged by a large direct current (DC), the filter 18 is a must for filtering out the DC part of the PWM signal $V_{PWN}$. However, in this case, the capacitor of the filter 18 is charged and discharged periodically by the PWM signal $V_{PWN}$ even in a non-active input period.

Although, to implement the filter 18 between the power amplifier stage 17 and the load 2 can be used for filtering out the large DC carrier signal before it reached load 2, but the implementation of the filter may raise production cost, enlarge circuit occupying area, and increase the static power consumption of the class-D amplifier 1.

Figure 3:
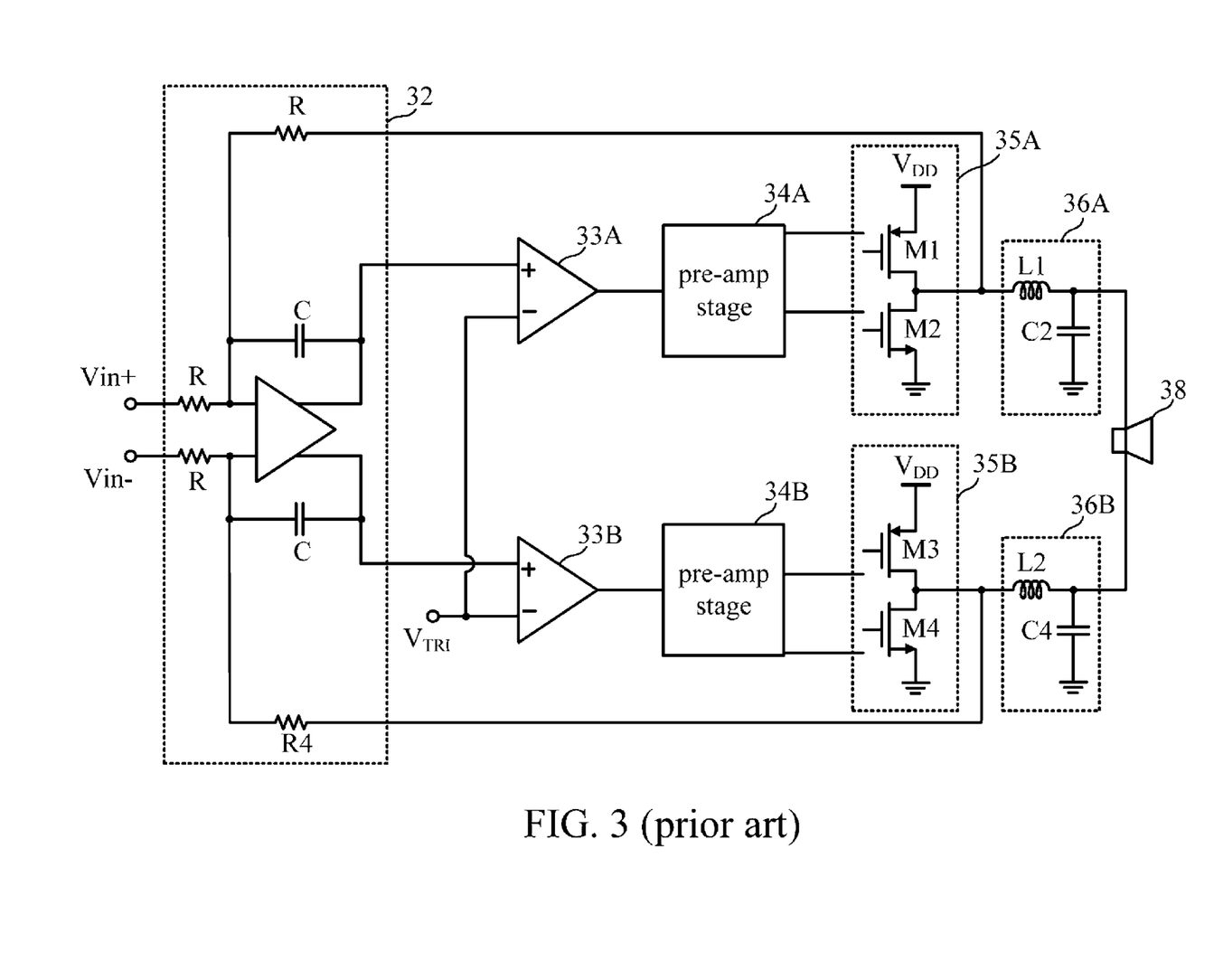
FIG. 3 is a schematic diagram illustrating a circuit structure of a full-bridged class-D amplifier in prior art.
Figure 4:
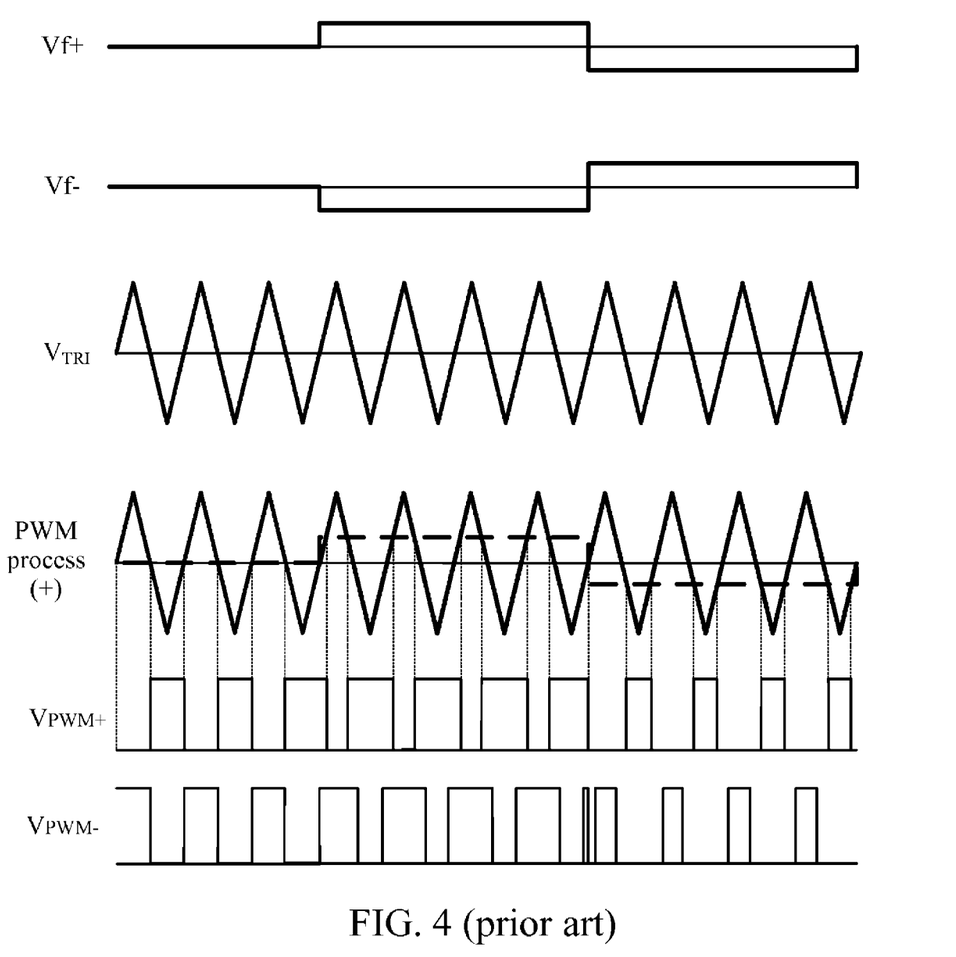
FIG. 4 is a timing diagram illustrating a signal sampling example of one set of integration signals, a triangle wave signal, one set of PWM signals in the class-D amplifier in prior art.

Please refer to FIG. 3 and FIG. 4. FIG. 3 is a schematic diagram illustrating a circuit structure of a full-bridged class-D amplifier 3 in prior art. FIG. 4 is a timing diagram illustrating a signal sampling example of one set of integration signals (positive integration signal Vf+ and negative integration signal Vf−), a triangle wave signal $V_{TRI}$, one set of PWM signals (positive PWM signal $V_{PWN+}$ and negative PWM signal $V_{PWN−}$) in the class-D amplifier 3 in prior art. In this example, the integrator 32 receives the positive analog signal Vin+ and negative analog signal Vin−, and then outputs the integration outcomes (Vf+, Vf−) to the comparator 34A and the comparator 34B respectively. Afterward, the outputs of the comparators 34A, 34B goes through the process of pre-amp stages (36A, 36B), power amplifier stages (37A, 37B) and filters (38A, 38B), and then the outcomes are used for driving the speaker 4. In this case, the integrator 32 and the comparators 34A, 34B can be views as the PWM circuit.

As shown in FIG. 4. When the integration signals (Vf+, Vf−) is stable at one level (i.e. there is no active input), the PWM signals ($V_{PWN+}$, $V_{PWN−}$) has a 50-50 voltage level distribution, which means that the PWM signals has 50% at high level and 50% at low level, and in the mean time the PWM signals are opposed-phased to each other. In this case, the PWM signals are coupled to two terminals of the load 4. In other words, the load 4 is controlled based on the differential portion between the PWM signals ($V_{PWN+}$, $V_{PWN−}$). However, while driving the speaker 4 with opposite-phased PWM signals ($V_{PWN+}$, $V_{PWN−}$), a large DC signal might be induced to the load 4. Therefore, the class-D amplifier in this embodiment also needs to implement a filter for preventing the speaker 4 from being damaged by a large direct current (DC). In this case, the capacitor of the filter is charged and discharged periodically by the differential portion between the PWM signals ($V_{PWN+}$, $V_{PWN−}$) even in a non-active input period. It increases the static power consumption of the class-D amplifier 3.

The invention discloses a class-D amplifier adopting in-phased differential pulse-width modulation, such that the class-D amplifier may drive a load in a filterless way, so as to solve aforesaid problems.

SUMMARY OF THE INVENTION

A scope of the invention is to provide a class-D amplifier, which is used for pushing a two-terminal load according to a set of analog signals.

According to an embodiment, the class-D amplifier includes a pulse-width modulation (PWM) circuit, a signal processing circuit and a driving amplifier circuit. The PWM circuit is used for receiving and converting the set of analog signals into a set of in-phased PWM signals. The signal processing circuit is electrically connected to the PWM circuit. The signal processing circuit receives the set of PWM signals and generates a set of pulse signals. The set of pulse signals being attached to the set of PWM signals. The driving amplifier circuit is coupled between the signal processing circuit and the two-terminal load. The driving amplifier circuit receives and amplifies the set of processed PWM signals, so as to drive the two-terminal load in a filterless way.

When there is a differential active state between the set of PWM signals, the set of pulse signals of the signal processing circuit can be used for prolonging the differential active state of the set of differential PWM signals.

Compared with traditional class-D amplifier which utilizes opposed-phased PWM signals to drive the two-terminal load in differential way, the class-D amplifier in the invention converts the incoming analog signals into a set of in-phased PWM signals for driving the two-terminal load in the filterless way, such that the static power consumption of the class-D amplifier can be reduced. Besides, the class-D amplifier has the signal processing circuit for prolonging the differential active state of the set of differential PWM signals, such that it can eliminate the crossover distortion of the PWM signals while the driving amplifier circuit processing the PWM signals.

The advantage and spirit of the invention may be understood by the following recitations together with the appended drawings.

DETAILED DESCRIPTION OF THE INVENTION

Figure 5:
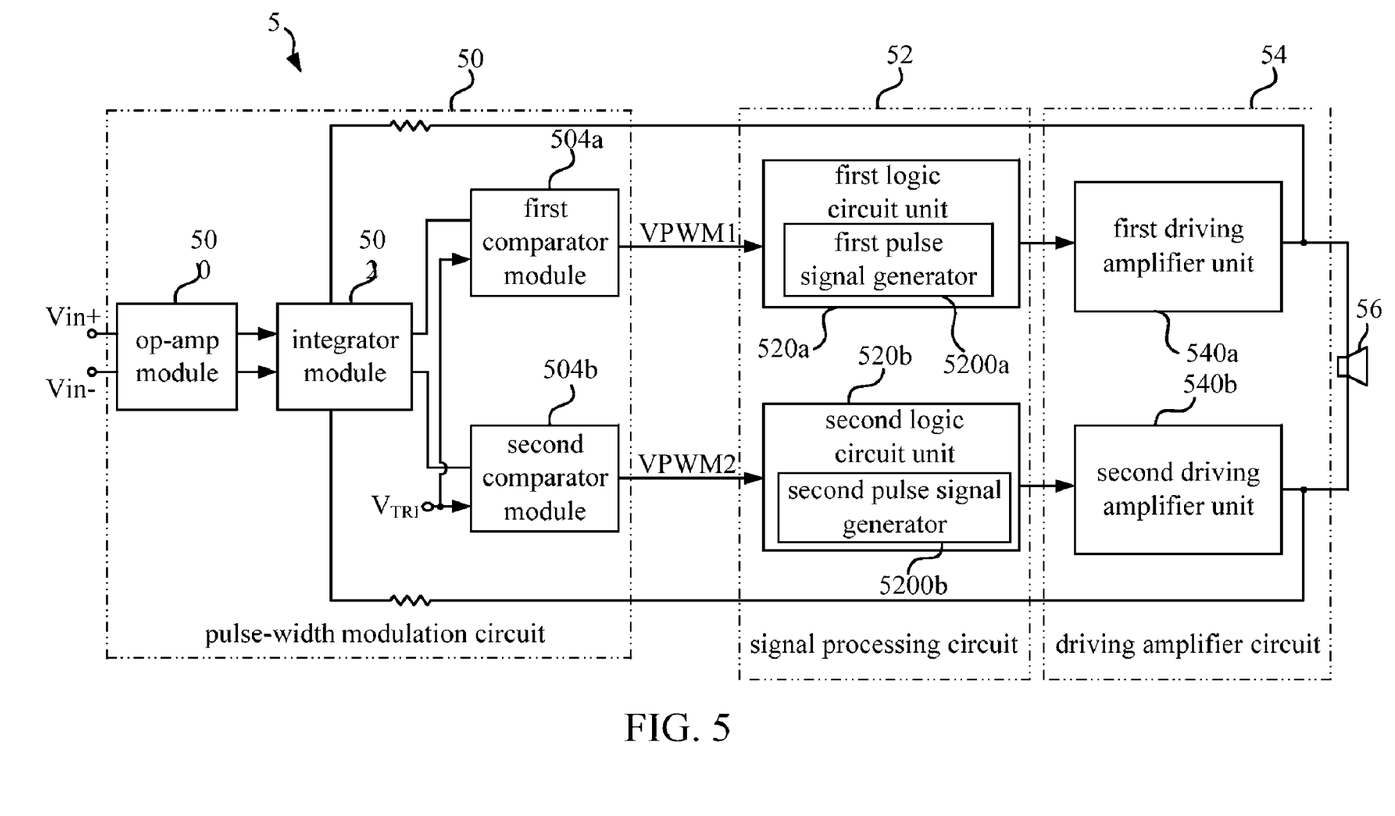
FIG. 5 is a schematic diagram illustrating a class-D amplifier according to a first embodiment of the invention.
Figure 6:
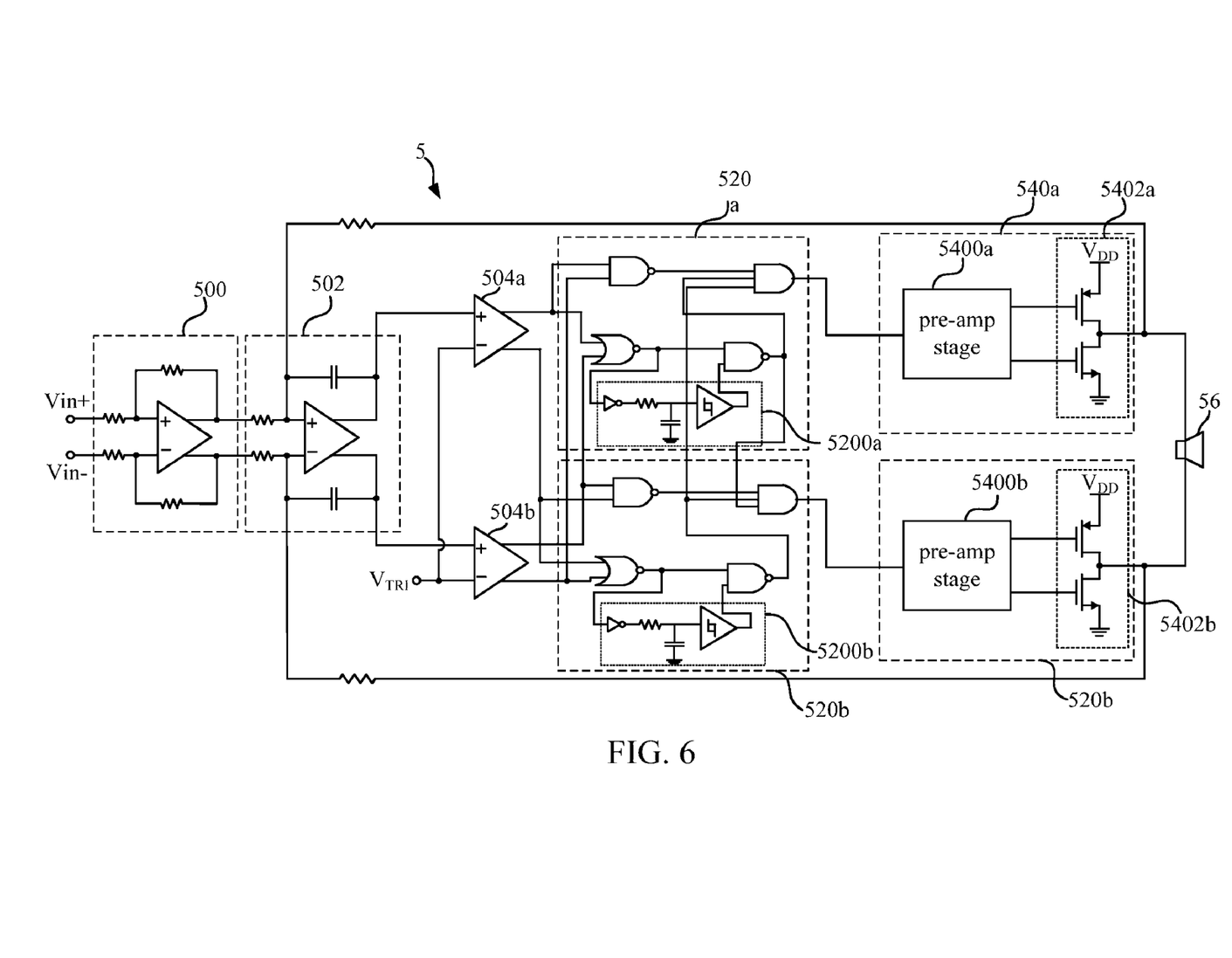
FIG. 6 is a circuit structural diagram illustrating the class-D amplifier in FIG. 5.

Please refer to FIG. 5 and FIG. 6. FIG. 5 is a schematic diagram illustrating a class-D amplifier 5 according to a first embodiment of the invention. FIG. 6 is a circuit structural diagram illustrating the class-D amplifier 5 in FIG. 5. In practical applications, the class-D amplifier 5 is used for pushing a two-terminal load 56 (e.g. speaker) according to a set of analog signals (e.g. one set of differential audio input signals). As shown in FIG. 5, the class-D amplifier 5 drives the two-terminal load 56 in a filterless way. In this embodiment, the class-D amplifier 5 includes a pulse-width modulation (PWM) circuit 50, a signal processing circuit 52 and a driving amplifier circuit 54.

The PWM circuit 50 receives analog signals (Vin+, Vin−), and the PWM circuit 50 utilizes its internal component to convert the set of analog signals (Vin+, Vin−) into a set of in-phased PWM signals, which are the first PWM signal $V_{PWN1}$ and the second PWM signal $V_{PWN2}$, as shown in FIG. 5. In the embodiment, the PWM circuit 50 may include an operational amplifier (op-amp) module 500, an integrator module 502, a first comparator module 504a and a second comparator module 504b. The op-amp module 500 may receive and amplify the set of analog signals in advance, for elevating the signal strength of the analog signals to a proper level before the follow-up PWM process. After the set of analog signals go through the process of the op-amp module 500, the integrator module 502 generates a first integration signal and a second integration signal according to the set of analog signals. The first integration signal and the second integration signal are transmitted to the first comparator module 504a and the second comparator module 504b respectively. The first comparator 504a module compares the first integration signal with a triangle wave signal for generating the first PWM signal $V_{PWN1}$. The second comparator module 504b compares the second integration signal with the triangle wave signal for generating the second PWM signal $V_{PWN2}$.

To be noticed that, the first PWM signal $V_{PWN1}$ and the second PWM signal $V_{PWN2}$ are one set of in-phased PWM signals. In practical applications, the first PWM signal $V_{PWN1}$ and the second PWM signal $V_{PWN}$ can be set up to have the same phase by adjusting the comparison logic or the triangle signal applied in two comparator modules. For example, designers may reserve the one of the triangle signals to the comparator modules or exchange the two input terminals of the comparator modules, to achieve the in-phased set of PWM signals.

Figure 7:
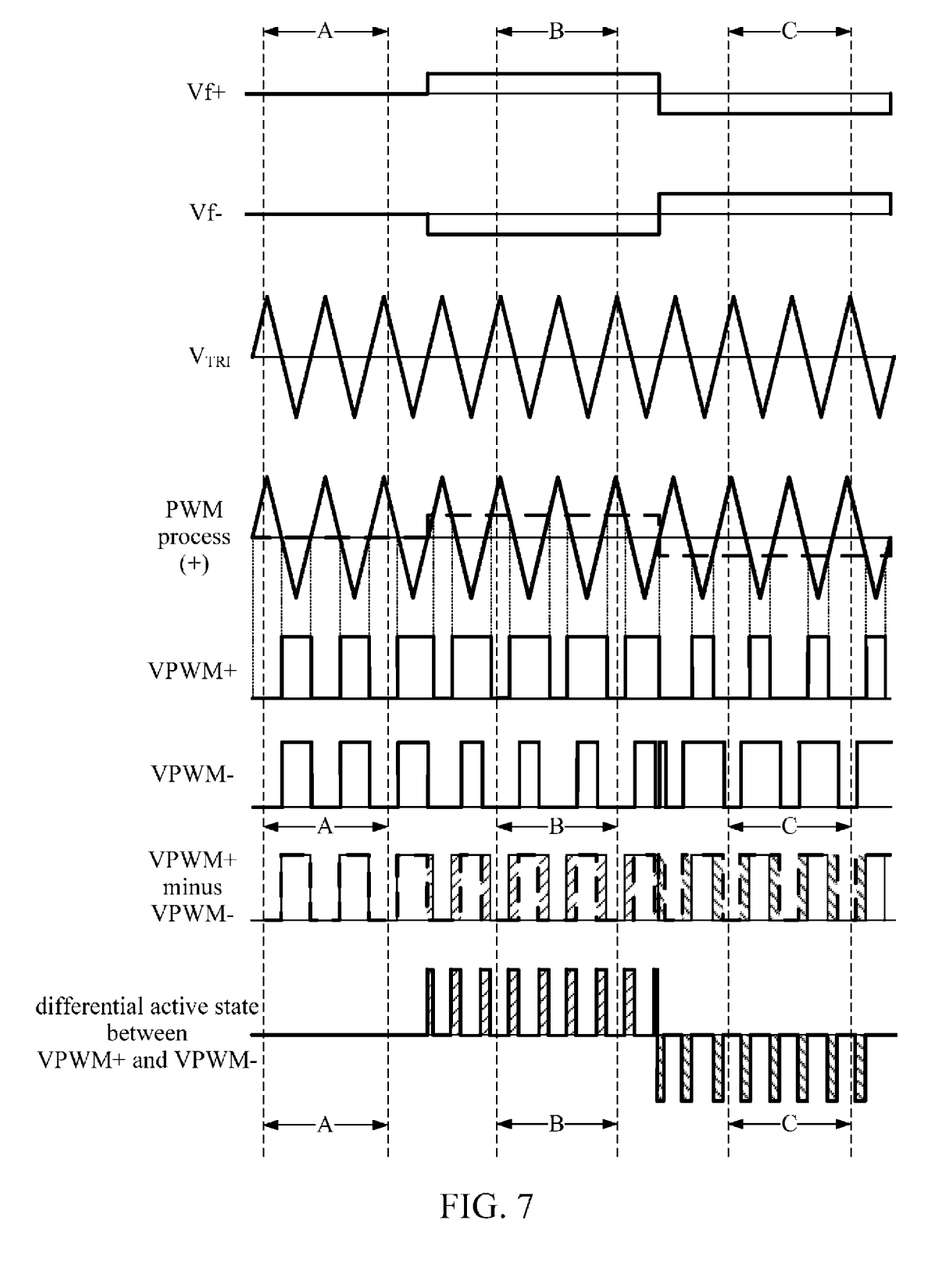
FIG. 7 is a timing diagram illustrating a signal sampling example of one set of integration signals, a triangle wave signal, sampling example of PWM process, one set of PWM signals and the differential relationship between two PWM signals in the class-D amplifier in prior art.

Please refer to FIG. 7 as well. FIG. 7 is a timing diagram illustrating a signal sampling example of one set of integration signals (positive integration signal Vf+ and negative integration signal Vf−), a triangle wave signal $V_{TRI}$, sampling example of PWM process, one set of PWM signals (the first PWM signal $V_{PWN1}$ and the second PWM signal $V_{PWN2}$) and the differential relationship between two PWM signals in the class-D amplifier 5 in prior art.

As shown in FIG. 7, the PWM circuit 50 of the class-D amplifier 5 in this embodiment may perform the pulse-width modulation process on integrated analog signals (Vin+, Vin−) and covert them into the first PWM signal $V_{PWN1}$ and the second PWM signal $V_{PWN2}$ in the same phase.

As shown in FIG. 5, the first PWM signal $V_{PWN1}$ and the second PWM signal $V_{PWN2}$ generated by the PWM circuit 50 is transmitted to the signal processing circuit 52 and the driving amplifier circuit 54, and then be used for driving the two-terminal load 56. Two ends of the two-terminal load 56 are connected to the first PWM signal $V_{PWN1}$ and the second PWM signal $V_{PWN2}$ respectively. Accordingly, the two-terminal load 56 functions (e.g. playing music) according to the differential portion of these two signals.

The signal processing circuit 52 in the embodiment includes a first logic circuit unit 520a and a second logic circuit unit 520b, which are respectively coupled between the PWM circuit 50 and the driving amplifier circuit 54. The first logic circuit unit 520a is used for receiving the first PWM signal $V_{PWN1}$. The first logic circuit unit 520a includes a first pulse signal generator 5200a. The second logic circuit unit 520b is used for receiving the second PWM signal $V_{PWN2}$. The second logic circuit unit 520b includes a second pulse signal generator 5200b.

As shown in FIG. 5, the driving amplifier circuit 54 may includes a first driving amplifier unit 540a and a second driving amplifier unit 540b. These two driving amplifier units are electrically connected to aforesaid two sets of logic circuit units.

On the other side, the first driving amplifier unit 540a and the second driving amplifier unit 540b are respectively coupled to two terminals of the two-terminal load 56. The driving amplifier circuit 54 utilizes the first driving amplifier unit 540a and the second driving amplifier unit 540b to amplify two sets of PWM signals, so as to drive the two-terminal load 56 with the differential portion between the PWM signals.

As shown in FIG. 6, the class-D amplifier 5 in the embodiment further includes a feedback loop. The feedback loop is used for coupling an output stage of the driving amplifier circuit 54 to an input stage of the integrator module 502.

As shown in FIG. 7. When there is no active input, the in-phase pair of first PWM signal and second PWM signal ($V_{PWN1}$, $V_{PWN2}$) is stable at one base level (as the region A in FIG. 7). In other words, when the integration signals (Vf+, Vf−) are stable at base level, the PWM signals ($V_{PWN1}$, $V_{PWN2}$) of the class-D amplifier 5 are in the same phase and has a 50-50 voltage level distribution. As the region A shown in FIG. 7, the in-phased PWM signals ($V_{PWN+}$, $V_{PWN-}$) have identical waveform in this case. There is no voltage difference between these two PWM signals in this period. When there is no active input, there is no differential portion existed between the first and the second PWM signals ($V_{PWN1}$, $V_{PWN2}$). Without voltage difference between the PWM signals, there is no current induced through the two-terminal load 56, such that the static power consumption can be reduced.

The following paragraph describes an example when the integration outcome of the input analog signal is located at high level (i.e. the positive integration signal Vf+ exceeds one reference level, as the region B shown in FIG. 7). In this region, the high level part of the first PWM signal $V_{PWN1}$ is prolonged and the high level part of the second PWM signal $V_{PWN2}$ is shorten. Accordingly, the difference between the first PWM signal $V_{PWN1}$ and the second PWM signal $V_{PWN2}$ form a differential portion (as the slash part in region B shown in FIG. 7) for driving the two-terminal load 56. The differential portion between the first PWM signal $V_{PWN1}$ and the second PWM signal $V_{PWN2}$ can be viewed as a differential active state between the set of PWM signals.

On the other hand, the following paragraph describes an example when the integration outcome of the input analog signal is located at low level (i.e. the positive integration signal Vf+ is under one reference level, as the region C shown in FIG. 7). In this region, the high level part of the first PWM signal $V_{PWN1}$ is shorten and the high level part of the second PWM signal $V_{PWN2}$ is prolonged. Accordingly, the difference between the first PWM signal $V_{PWN1}$ and the second PWM signal $V_{PWN2}$ form another differential portion with reverse voltage difference (as the slash part in region C shown in FIG. 7) for driving the two-terminal load 56. In this case, the differential portion between the first PWM signal $V_{PWN1}$ and the second PWM signal $V_{PWN2}$ may also be viewed as a differential active state between the set of PWM signals.

In prior art, the traditional class-D amplifier utilizes opposed-phased PWM signals to drive the two-terminal load in differential way. There is a voltage difference between opposed-phased PWM signals in prior art even in the period with no active input, and the voltage difference cause unwanted power consumption. Compared with traditional circuit, the class-D amplifier 5 in the invention utilizes a set of in-phased PWM signals ($V_{PWN1}$, $V_{PWN2}$) for delivering information, such that the static power consumption only happens during short differential period between two PWM signals. Therefore, the overall power consumption of the class-D amplifier 5 can be reduced. On the other hand, under the circuit structure of the invention, the filter before the two-terminal load can be omitted. The class-D amplifier 5 in the invention may drive the two-terminal load in a filterless way. In this way, the production cost, power consumption and chip size of the class-D amplifier can be reduced at once.

Besides, each driving amplifier unit (540a or 540b) may further include a pre-amp stage (5400a or 5400b) and a power amplifier stage (5402a, 5402b). In general, there might be some distortions occurring while the signal on the pre-amp stage and the power amplifier stage is switching. Especially when the signal goes across the zero voltage level, a crossover distortion will occur to a traditional class-D amplifier if the persisting time of the voltage state of the PWM signal is too short.

The class-D amplifier 5 in the invention can avoid the crossover distortion. In the logic units (520a, 520b) of the signal processing circuit 52, the first pulse signal generator 5200a includes a first RC oscillator and a first amplifier. The first amplifier is electrically connected with the first RC oscillator. The first RC oscillator is used for generating a first oscillating signal. The first amplifier amplifies the first oscillating signal for forming a first pulse signal. Equivalently, the second pulse signal generator 5200b includes a second RC oscillator and a second amplifier for generating a second pulse signal.

In this embodiment the first pulse signal and the second pulse signal are generated at the time spot corresponding to the positive edge or the negative edge of the set of the PWM signals ($V_{PWN1}$, $V_{PWN2}$).

The first pulse signal generated by the first pulse signal generator is used for attaching to the first PWM signal $V_{PWN1}$. The second pulse signal generated by the second pulse signal generator is used for attaching to the first PWM signal $V_{PWN2}$. When there is a differential active state between the set of PWM signals (as shown in FIG. 7), the set of pulse signals generated by the logic circuit units (520a, 520b) of the signal processing circuit 52 are utilized to prolong the differential active state of the set of differential PWM signals, in order to prevent the crossover distortion which might be induced when the persisting time of the PWM signal is too short. In other words, the signal processing circuit 52 of the class-D amplifier 5 can ensure the PWM signals driving the two-terminal load 56 precisely.

Compared with traditional class-D amplifier which utilizes opposed-phased PWM signals to drive the two-terminal load in differential way, the class-D amplifier in the invention converts the incoming analog signals into a set of in-phased PWM signals for driving the two-terminal load in the filterless way, such that the static power consumption of the class-D amplifier can be reduced. Besides, the class-D amplifier has the signal processing circuit for prolonging the differential active state of the set of differential PWM signals, such that it can eliminate the crossover distortion of the PWM signals while the driving amplifier circuit processing the PWM signals.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A class-D amplifier, used for pushing a two-terminal load according to a set of analog signals, comprising:
   a pulse-width modulation (PWM) circuit used for receiving and converting the set of analog signals into a set of in-phased PWM signals;
   a signal processing circuit electrically connected to the PWM circuit, the signal processing circuit receiving the set of PWM signals and generating a set of pulse signals, the set of pulse signals being attached to the set of PWM signals; and
   a driving amplifier circuit coupled between the signal processing circuit and the two-terminal load, the driving amplifier circuit receiving and amplifying the set of processed PWM signals, so as to drive the two-terminal load in a filterless way;
   wherein when there is a differential active state between the set of PWM signals, the set of pulse signals of the signal processing circuit prolong the differential active state of the set of differential PWM signals.

2. The class-D amplifier of claim 1, wherein the PWM circuit comprises:
   an integrator module generating a set of integration signals according to the set of analog signals, the set of integration signals comprising a first integration signal and a second integration signal;
   a first comparator module receiving the first integration signal, the first comparator module comparing the first integration signal with a triangle wave signal and generating a first PWM signal; and
   a second comparator module receiving the second integration signal, the second comparator module comparing the second integration signal with the triangle wave signal and generating a second PWM signal, the second PWM signal being in-phased with the first PWM signal;
   wherein the first PWM signal and the second PWM signal serves as the set of PWM signals.

3. The class-D amplifier of claim 2, further comprising a feedback loop, the feedback loop is used for coupling an output stage of the driving amplifier circuit to an input stage of the integrator module.

4. The class-D amplifier of claim 1, wherein the set of PWM signals comprises a first PWM signal and a second PWM signal, the signal processing circuit further comprising:
   a first logic circuit unit coupled between the PWM circuit and the driving amplifier circuit, the first logic circuit unit receiving the first PWM signal and comprising a first pulse signal generator, the first pulse signal generator generating a first pulse signal for attaching to the first PWM signal; and
   a second logic circuit unit coupled between the PWM circuit and the driving amplifier circuit, the second logic circuit unit receiving the second PWM signal and comprising a second pulse signal generator, the second pulse signal generator generating a second pulse signal for attaching to the second PWM signal;
   wherein the first pulse signal and the second pulse signal serves as the set of pulse signals.

5. The class-D amplifier of claim 4, wherein the first pulse signal generator comprises:
   a first RC oscillator for generating a first oscillating signal; and
   a first amplifier electrically connected with the first RC oscillator, the first amplifier amplifying the first oscillating signal for forming the first pulse signal.

6. The class-D amplifier of claim 5, wherein the second pulse signal generator comprises:
   a second RC oscillator for generating a second oscillating signal; and
   a second amplifier electrically connected with the second RC oscillator, the second amplifier amplifying the second oscillating signal for forming the second pulse signal.

7. The class-D amplifier of claim 4, wherein the driving amplifier circuit comprising:
   a first driving amplifier unit and a second driving amplifier unit, the first driving amplifier unit being electrically connected to the first logic circuit unit, the second driving amplifier unit being electrically connected to the second driving circuit unit, the first driving amplifier unit and the second driving amplifier unit being respectively coupled to two terminals of the two-terminal load, the driving amplifier circuit utilizing the first driving amplifier unit and the second driving amplifier unit for amplifying the first PWM signal and the second PWM signal, so as to drive the two-terminal load.

* * * * *